United States Patent
Lei et al.

(10) Patent No.: US 11,574,753 B2
(45) Date of Patent: Feb. 7, 2023

(54) SUPPORT DEVICE AND DISPLAY APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Sijun Lei, Beijing (CN); Liang Gao, Beijing (CN); Yuxu Geng, Beijing (CN); Dengqian Li, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 665 days.

(21) Appl. No.: 16/488,473

(22) PCT Filed: Apr. 19, 2019

(86) PCT No.: PCT/CN2019/083471
§ 371 (c)(1),
(2) Date: Aug. 23, 2019

(87) PCT Pub. No.: WO2019/214421
PCT Pub. Date: Nov. 14, 2019

(65) Prior Publication Data
US 2021/0383952 A1 Dec. 9, 2021

(30) Foreign Application Priority Data
May 10, 2018 (CN) .......................... 201820693527.0

(51) Int. Cl.
*H01F 6/06* (2006.01)
*H01F 6/04* (2006.01)
(Continued)

(52) U.S. Cl.
CPC ................. *H01F 6/04* (2013.01); *H01F 6/06* (2013.01); *H02N 15/00* (2013.01); *H05K 5/0234* (2013.01)

(58) Field of Classification Search
CPC .............. H01F 6/04; H01F 6/06; H02N 15/00
See application file for complete search history.

(56) References Cited

U.S. PATENT DOCUMENTS

| 5,446,018 | A | * | 8/1995 | Takahata | ................. | F16C 39/02 |
| | | | | | | 310/90.5 |
| 5,801,469 | A | * | 9/1998 | Takahata | ............. | F16C 32/0438 |
| | | | | | | 310/90.5 |

(Continued)

FOREIGN PATENT DOCUMENTS

| CN | 202563167 U | 11/2012 |
| CN | 103093704 B | 3/2015 |

(Continued)

*Primary Examiner* — Alexander Talpalatski
(74) *Attorney, Agent, or Firm* — Nath, Goldberg & Meyer; Joshua B. Goldberg

(57) ABSTRACT

The present disclosure provides a support device and a display apparatus. The support device includes: a support platform; a base disposed opposite to the support platform; and a plurality of superconducting magnetic levitation structures, each of the superconducting magnetic levitation structures including a superconductor and a magnet disposed oppositely; in each of the superconducting magnetic levitation structures, one of the superconductor and the magnet is disposed on the support platform, and the other is disposed on the base. The plurality of superconducting magnetic levitation structures are arranged to operate independently of each other without interference, and a repulsive force (Continued)

between the superconductor and the magnet of each of the superconducting magnetic levitation structures is set to be adjustable.

12 Claims, 3 Drawing Sheets

(51) Int. Cl.
*H02N 15/00* (2006.01)
*H05K 5/02* (2006.01)

(56) References Cited

U.S. PATENT DOCUMENTS

| | | | | |
|---|---|---|---|---|
| 8,505,463 | B2* | 8/2013 | Kwon | B60L 13/10 |
| | | | | 104/281 |
| 9,508,478 | B1* | 11/2016 | Honein | H01F 6/04 |
| 2003/0217668 | A1* | 11/2003 | Fiske | B60L 13/04 |
| | | | | 104/282 |
| 2008/0122308 | A1* | 5/2008 | Mleux | H02N 15/00 |
| | | | | 310/68 B |
| 2010/0126374 | A1* | 5/2010 | Ji | B61B 13/08 |
| | | | | 104/282 |
| 2018/0111505 | A1* | 4/2018 | Caron | B60L 13/04 |
| 2019/0366853 | A1* | 12/2019 | Qu | B60K 1/00 |

FOREIGN PATENT DOCUMENTS

| | | |
|---|---|---|
| CN | 104464548 A | 3/2015 |
| CN | 104886924 A | 9/2015 |
| CN | 105810057 A | 7/2016 |
| CN | 206541525 U | 10/2017 |
| CN | 207005663 U | 2/2018 |
| CN | 208061578 U | 11/2018 |
| RU | 1396458 A1 | 12/1993 |

* cited by examiner

SUPPORT DEVICE AND DISPLAY APPARATUS

CROSS-REFERENCE TO RELATED APPLICATIONS

This is a National Phase application filed under 35 U.S.C. 371 as a national stage of PCT/CN2019/083471, filed Apr. 19, 2019, an application claiming the benefit of Chinese Patent Application No. 201820693527.0 filed with the Chinese Intellectual Property Office on May 10, 2018, the disclosure of which is incorporated herein by reference in its entirety.

TECHNICAL FIELD

The present disclosure relates to the field of magnetic levitation, and particularly relates to a support device and a display apparatus.

BACKGROUND

Currently, when a display device such as an electronic picture frame is placed, it is usually required to be supported on a support frame. However, this placement method is too traditional, and the user cannot view the display device and its display screen from multiple angles. For this reason, some manufacturers have begun to use the magnetic levitation method for levitated support of the display device.

SUMMARY

The present disclosure provides a support device and a display apparatus capable of obliquely levitating a display device.

According to an aspect of the disclosure, there is provided a support device, including:

a support platform;

a base disposed opposite to the support platform; and a plurality of superconducting magnetic levitation structures, each of the superconducting magnetic levitation structures including a superconductor and a magnet disposed oppositely, in each of the superconducting magnetic levitation structures, one of the superconductor and the magnet is disposed on the support platform, and the other is disposed on the base, wherein the plurality of superconducting magnetic levitation structures are arranged to operate independently of each other without interference, and a repulsive force between the superconductor and the magnet of each of the superconducting magnetic levitation structures is set to be adjustable.

In some embodiments, each of the superconducting magnetic levitation structures further includes a temperature control device configured to adjust a temperature of the superconductor, the temperature of each superconductor being independently adjustable.

In some embodiments, the magnet is an electromagnet configured to generate an adjustable magnetic field.

In some embodiments, the superconductor in each of the superconducting magnetic levitation structures is disposed on the support platform, and the magnet is disposed on the base.

In some embodiments, the support platform includes a mounting layer and an electromagnetic shielding layer, the electromagnetic shielding layer is located on a side of the mounting layer facing away from the base, and the superconductor is disposed inside the mounting layer.

In some embodiments, the mounting layer is provided with a vacuum heat insulation chamber that divides the mounting layer into a plurality of mounting portions each of which provided with one superconductor.

In some embodiments, the temperature control device and the superconductor are disposed adjacent to and spaced apart from each other in each of the mounting portions.

In some embodiments, the temperature control device is disposed to surround the superconductor in each of the mounting portions.

In some embodiments, the temperature control device and the superconductor are in contact with each other.

In some embodiments, an isolation device adjacent to the electromagnetic shielding layer and the vacuum heat insulation chamber is disposed in each of the mounting portions.

In some embodiments, the isolation device includes an electromagnetic isolation member disposed adjacent to the vacuum heat insulation chamber and a heat insulation member disposed adjacent to the electromagnetic shielding layer.

In some embodiments, an electromagnetic shielding member that separates the respective magnets from each other is disposed in the base.

In some embodiments, there are two superconducting magnetic levitation structures.

In some embodiments, there are three superconducting magnetic levitation structures.

In some embodiments, a material of the superconductor includes Yttrium Barium Copper Oxide (YBCO).

According to another aspect of the present disclosure, there is provided a display apparatus including a display device and the above support device, wherein the display device is disposed on a surface of the support platform facing away from the base.

BRIEF DESCRIPTION OF DRAWINGS

Accompanying drawings are provided for further understanding of this disclosure and constitute a part of the specification. Hereinafter, these drawings are intended to explain the disclosure together with the following specific embodiments, but should not be considered as a limitation of the disclosure, in which.

DETAILED DESCRIPTION

Hereinafter, specific embodiments of the present disclosure will be described in conjunction with accompanying drawings. It should be understood that the specific embodiments as set forth herein are merely for the purpose of illustration and explanation of the disclosure and should not be constructed as a limitation thereof.

In the related art, a display device can only be levitated above a horizontal plane, but cannot be obliquely levitated as desired, thereby affecting the viewing experience of the user.

Figure 1:
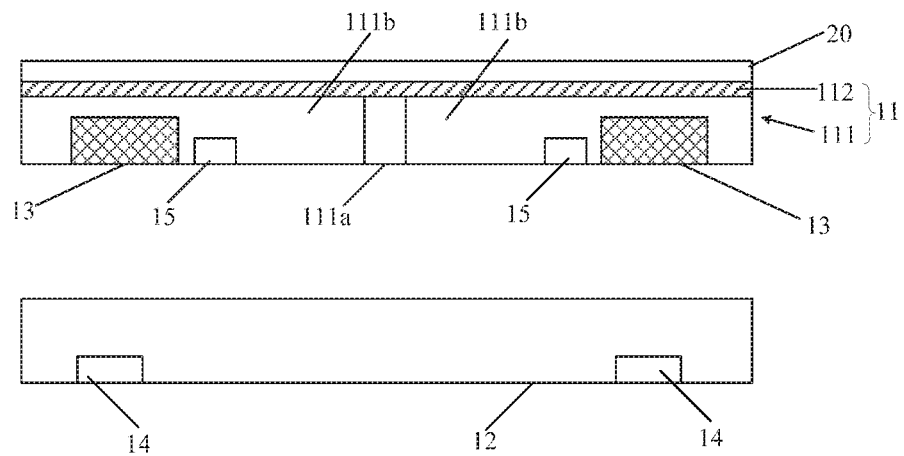
FIG. 1 is a schematic view of a support device supporting a display device horizontally according to an exemplary embodiment of the present disclosure.
Figure 2:
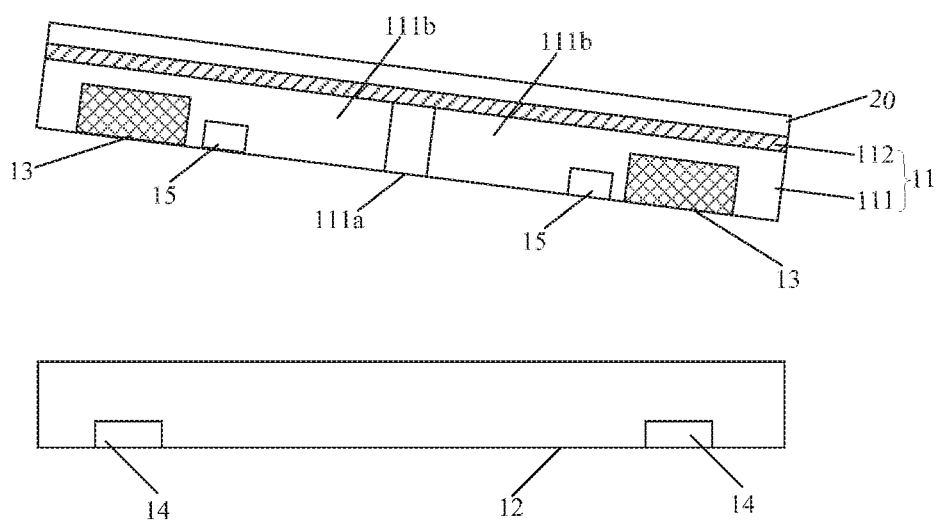
FIG. 2 is a schematic view of a support device supporting a display device obliquely according to an exemplary embodiment of the present disclosure.

As an aspect of the present disclosure, there is provided a support device that is particularly suitable for inclined support of a display device. As shown in FIGS. 1 and 2, the support device includes a support platform 11, a base 12, and a plurality of superconducting magnetic levitation structures. The support platform 11 and the base 12 are disposed oppositely, and each of the superconducting magnetic levitation structures includes a superconductor 13 and a magnet 14 disposed oppositely. In each of the superconducting magnetic levitation structures, one of the superconductor 13 and the magnet 14 is disposed on the support platform 11, and the other is disposed on the base 12. Any two superconductors 13 do not overlap in a thickness direction of the support platform 11, that is, orthographic projections of any two superconductors 13 on the support platform 11 do not overlap. A repulsive force that is adjustable is generated between the superconductor 13 and the magnet 14 of each of the superconducting magnetic levitation structures, and the repulsive force between the superconductor 13 and the magnet 14 may be independently controlled, that is, the repulsive force between the superconductor 13 and the magnet 14 of each of the superconducting magnetic levitation structures is adjustable, and adjustments of the repulsive forces of different superconducting magnetic levitation structures do not interfere with each other. That is, the plurality of superconducting magnetic levitation structures are arranged to operate independently of each other without interference.

According to the Meissner effect (i.e., the superconductor 13 is extremely diamagnetic in a superconducting state; and if a magnetic field generated by the magnet 14 is to pass through an inside of the superconductor 13, the superconductor 13 will inevitably generate a magnetic field opposite to the original magnetic field, thereby generating the repulsive force between the superconductor 13 and the magnet 14), when the repulsive force between the superconductor 13 and the magnet 14 reaches a certain level, the support platform 11 is levitated in the air. In the present disclosure, since the repulsive force between the superconductor 13 and the magnet 14 of each of the superconducting magnetic levitation structures is adjustable, and adjustments of the repulsive forces between the superconductor 13 and the magnet 14 in different superconducting magnetic levitation structures do not interfere with each other, the support platform 11 is placed in a horizontal state when the repulsive forces between the respective superconductors 13 and corresponding magnets 14 are adjusted to the same, and the support platform 11 is placed in an inclined state when the repulsive forces between different superconductors 13 and corresponding magnets 14 are not the same. In addition, in practical production, certain impurities are inevitable in the superconductor 13, which causes part of magnetic lines of force to pass through the superconductor 13, thereby causing the superconductor 13 to generate a strong "pinning force", and thus ensuring a relatively stable state between the support platform 11 and the base 12. Therefore, when supporting a display device, the support device of the present disclosure may enable the display device to be stably placed in an inclined state having an inclined angle that may be adjusted as desired.

As shown in FIGS. 1 and 2, specifically, the superconductor 13 in each of the superconducting magnetic levitation structures may be disposed in the support platform 11, and the magnet 14 may be disposed in the base 12. In an exemplary embodiment of the present disclosure, a material of the superconductor 13 includes Yttrium Barium Copper Oxide (YBCO) to obtain a higher superconducting critical temperature. The superconductor 13 may have a purity between 80% and 95%. Due to the impurities in the superconductor, the magnetic lines of force may pass through the impurities and produce a strong pinning force. Therefore, in practical applications, not only the support platform 11 may be placed above the base 12, but also the base 12 may be fixed above the support platform 11 (for example, fixed on the ceiling), thereby hanging the support platform 11 upside down by the strong pinning force, and thus hanging the display device upside down by fixing the display device to the support platform 11.

Figure 5:
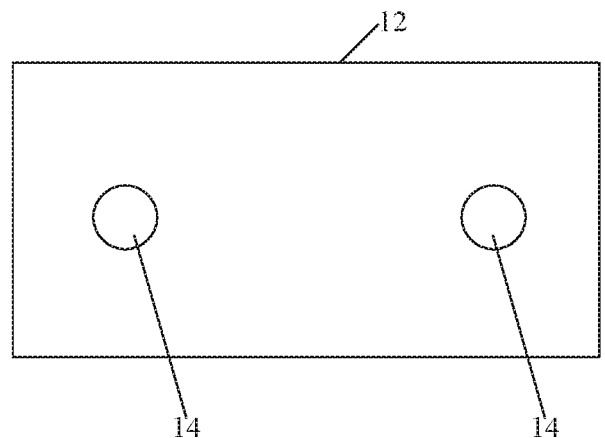
FIG. 5 is a schematic view showing a distribution of magnets in a support device according to an exemplary embodiment of the present disclosure.

In an exemplary embodiment of the present disclosure, in order to facilitate adjustment of the inclination angle of the support platform 11, two superconducting magnetic levitation structures may be provided, as shown in FIG. 5, in which two magnets 14 and correspondingly two superconductors 13 are included. Thus, the inclination angle of the support platform 11 may be adjusted at two locations by the above-described pinning force. It should be understood that the shape of the magnet 14 is not limited to a circular shape as shown in FIG. 5, but may be any suitable shape, such as an elongated shape, so that the support platform 11 may be more easily inclined up and down and left and right. In another exemplary embodiment of the present disclosure, three superconducting magnetic levitation structures are provided, i.e., three magnets 14 and three superconductors 13 are provided. Such design allows the support platform 11 to be supported more stably and reliably. It should be understood that the number of the superconducting magnetic levitation structures may be set as needed, for example, one or four or more.

In the present disclosure, the repulsive force between the superconductor 13 and the magnet 14 may be adjusted by adjusting a magnitude of the magnetic field generated by the magnet 14 and/or the temperature of the superconductor 13. Specifically, the magnet 14 is an electromagnet to create a magnetic field of an adjustable magnitude. The electromagnet includes a magnetic core and a coil. By adjusting a magnitude of current in the coil, the magnitude of the magnetic field generated by the magnet 14 may be adjusted, thereby adjusting the repulsive force between the superconductor 13 and the magnet 14 and thus the levitation state of the support platform 11.

The support device may further include a temperature control device (specifically, a wireless temperature control device) for adjusting a temperature of each of the superconductors 13, and controlling the superconductor 13 to enter a superconducting state by controlling the temperature of the same. Further, it is also possible to adjust a diamagnetic strength of each of the superconductors 13 by adjusting a temperature level of the superconductor 13, thereby adjusting the repulsive force between the superconductor 13 and the magnet 14. In addition, the temperature of each of the superconductors 13 may be adjusted independently, that is, the temperature adjustment processes of different superconductors 13 do not interfere with each other, so as to ensure that the repulsive forces between the superconductors 13 and the magnets 14 in different superconducting magnetic levitation structures do not interfere with each other.

In order to prevent the magnetic field generated by the magnet 14 from affecting a display image of the display device, in an exemplary embodiment of the present disclosure, the support platform 11 includes a mounting layer 111 and an electromagnetic shielding layer 112 disposed on the mounting layer 111 on a side of the mounting layer 111 facing away from the base 12, the superconductor 13 and the temperature control device 15 are both disposed in the mounting layer 111, the display device may be supported on a surface of the electromagnetic shielding layer 112 facing away from the mounting layer 111, and the electromagnetic shielding layer 112 is used for shielding the magnetic field generated by the magnet 14, so as to reduce defects due to an influence of the electromagnetic field on the display screen.

In an exemplary embodiment of the present disclosure, as shown in FIGS. 1 and 2, the mounting layer 111 is further provided with a vacuum heat insulation chamber 111a that divides the mounting layer 111 into a plurality of mounting portions 111b each of which provided with one of the superconductors 13. The vacuum heat insulation chamber 111a spaces the superconductors 13, thereby facilitating the reduction of heat conduction between the superconductors 13, and thus avoiding mutual interference of the repulsive forces between the superconductors 13 and the magnets 14 of the respective superconducting magnetic levitation structures.

Figure 3:
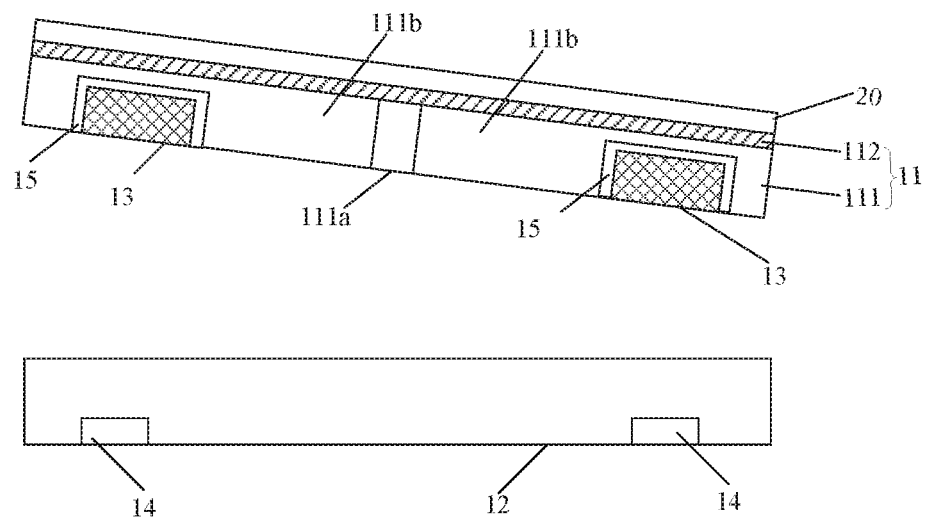
FIG. 3 is a schematic view of another support device according to an exemplary embodiment of the present disclosure.

In an exemplary embodiment of the present disclosure, as shown in FIGS. 1 and 2, the mounting portion 111b may be a cavity in which the temperature control device 15 and the superconductor 13 are disposed adjacent to and spaced apart from each other. In this way, the temperature control device 15 may detect a temperature inside the mounting portion 111b, that is, the temperature of the superconductor 13, and may generate heat as needed and transfer the heat to the superconductor 13 so that the temperature of the superconductor 13 rises, or the heat inside the mounting portion 111b may be absorbed as needed, that is, the heat is absorbed from the superconductor 13 so that the temperature of the superconductor 13 is lowered. In this way, the temperature control device 15 may adjust the temperature of the superconductor and thus the repulsive force between the superconductor 13 and the magnet 14. In another exemplary embodiment of the present disclosure, as shown in FIG. 3, in each of the mounting portions 111b, the temperature control device 15 is disposed to surround the superconductor 13, that is, the temperature control device 15 encloses the superconductor 13. In this way, the temperature control device 15 may exchange heat with the superconductor 13 from a plurality of orientations so that a temperature change of the superconductor 13 may be controlled more efficiently, thereby improving timely adjustment of the inclination of the support platform 11. Further, the temperature control device 15 may be in contact with the superconductor 13. In this way, the temperature control device 15 may exchange heat with the superconductor 13 more rapidly, thereby further improving timely adjustment of the inclination of the support platform 11.

Figure 4:
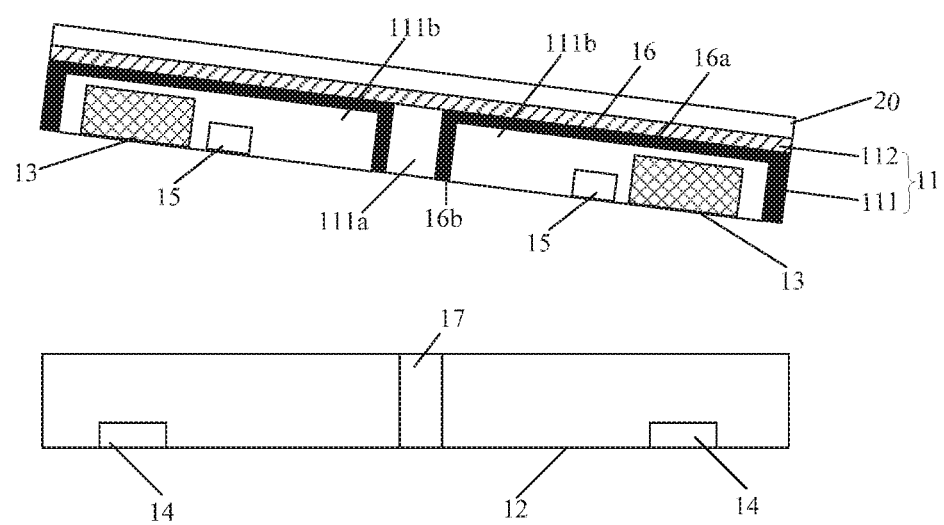
FIG. 4 is a schematic view of yet another support device according to an exemplary embodiment of the present disclosure.

In an exemplary embodiment of the present disclosure, in order to improve the independence of each superconducting magnetic levitation structure from each other, as shown in FIG. 4, an isolation device 16 adjacent to the electromagnetic shielding layer 112 and the vacuum heat insulation chamber 111a is disposed in each of the mounting portions 111b, wherein the isolation device 16 is indicated by the black blocks in FIG. 4. In each of the mounting portions 111b, the isolation device 16 encloses the temperature control device 15 and the superconductor 13 therein. In this way, the respective mounting portions 111b may be isolated from each other so that operations of the temperature control device 15 and the superconductor 13 in each of the mounting portions 111b are both undisturbed. More specifically, the isolation device 16 includes a heat insulation member 16a disposed adjacent to the electromagnetic shielding layer 112 and an electromagnetic isolation member 16b disposed adjacent to the vacuum heat insulation chamber 111a. In order to further improve the independence of the superconducting magnetic levitation structures from each other, in addition to the electromagnetic shielding function, the electromagnetic shielding layer 112 further needs to prevent heat transfer from one mounting portion 111b to another adjacent mounting portion 111b. The electromagnetic shielding layer 112 may have insufficient heat insulation performance when mainly used for shielding electromagnetism. Therefore, in order to further reduce heat transfer from the mounting portion 111b to the electromagnetic shielding layer 112, a heat insulation member 16a is provided on a side of the electromagnetic shielding layer 112 facing the mounting portion 111b. In addition to the heat insulation function, the vacuum heat insulation chamber 111a is further desired to prevent electromagnetic waves from one mounting portion 111b entering other mounting portions 111b. The vacuum heat insulation chamber 111a may have insufficient electromagnetic shielding performance when mainly used for heat insulation. Therefore, in order to further reduce electromagnetic waves from one mounting portion 111b entering other mounting portions 111b through the vacuum heat insulation chamber 111a, an electromagnetic isolation member 16b is disposed on a side of the vacuum heat insulation chamber 111a facing the mounting portion 111b. In this way, the independence of each superconducting magnetic levitation structure from each other is greatly improved.

In an exemplary embodiment of the present disclosure, in order to improve the independence of each superconducting magnetic levitation structure from each other, as shown in FIG. 4, an electromagnetic shielding member 17 separates the respective magnets 14 from each other is disposed in the base 12. The electromagnetic shielding member 17 is disposed between the respective magnets 14 to form a physical isolation layer of electromagnetic waves, by which one magnet 14 may be operated without affecting another magnet 14 and the superconductor 13 corresponding to that magnet 14, thereby each magnet 14 and its corresponding superconductor 13 are allowed to be operated independently.

As another aspect of the present disclosure, there is provided a display apparatus including a display device 20 and the above-described support device. As shown in FIGS. 1 to 4, the display device 20 is disposed on a surface of the support platform 11 facing away from the base 12. The display device 20 may be an electronic picture frame, an OLED panel, a navigator, a tablet, or the like.

Since the support platform 11 of the support device can be placed stably in a horizontal or inclined state, the display device 20 can perform a horizontal levitation or an inclined levitation at any angle stably, thereby satisfying different needs of users and improving user experience.

Figure 6:
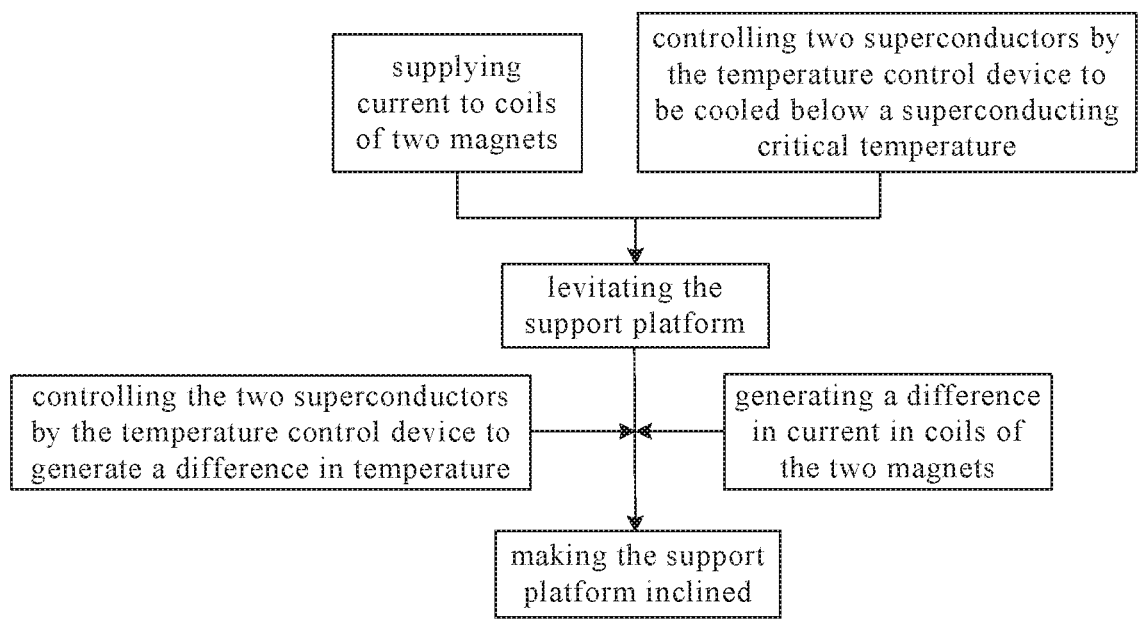
FIG. 6 is a flowchart of controlling a display device to be obliquely levitated according to an exemplary embodiment of the present disclosure.

For the case where the support device includes two superconducting magnetic levitation structures, in order to control the horizontal levitation of the display device 20, the two superconductors 13 may be controlled by the temperature control device 15 to be cooled below a superconducting critical temperature to bring the superconductor 13 into a superconducting state and make the temperatures of the two superconductors 13 the same. Further, the same current is supplied to coils of the two electromagnets to generate the same magnetic field so that the two superconductors 13 have the same height to horizontally levitate the support platform 11 and the display device 20 (as shown in FIG. 1). A flowchart of controlling the display device 20 to be obliquely levitated is show in FIG. 6. Current is supplied to coils of the two magnets 14, and the two superconductors 13 are controlled by the temperature control device 15 to be cooled below the superconducting critical temperature to allow the superconductor 13 to enter the superconducting state, thereby levitating the support platform 11. Further, the temperature control device 15 controls the two superconductors 13 to generate a difference in temperature or controls the coils of the two electromagnets to generate a difference in current so that the support platform 11 has different heights on left and right sides and thus is inclined. Specifically, in order to make the display device 20 incline to the right (as shown in FIG. 2), the two superconductors 13 may be controlled to have the same temperature, and the coil of the left magnet 14 may be supplied with a higher current than that of the right one so that the left magnet 14 generate a larger magnetic field that makes the support platform 11 has a greater height on the left side than on the right side, thereby realizing the inclined levitation of the support platform 11 and the display device to the right. Alternatively, the coils of the two magnets 14 may be maintained at the same current, and the temperature control device 15 is used to control the temperature of the right superconductor 13 to be greater than that of the left one so that the support platform 11 has a greater height on the left side than on the right side. Apparently, it is also possible to simultaneously control the current in the coils of the two magnets 14 and the temperatures of the two superconductors 13 to achieve inclined levitation of the support platform 11 and the display device 20. The principle of inclining the display device to the left is the same as the principle of inclining to the right, which will not be repeated here.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A support device, comprising:
a support platform;
a base disposed opposite to the support platform; and
a plurality of superconducting magnetic levitation structures, each of the superconducting magnetic levitation structures comprising a superconductor and a magnet disposed oppositely, in each of the superconducting magnetic levitation structures, one of the superconductor and the magnet is disposed on the support platform, and the other is disposed on the base,
wherein the plurality of superconducting magnetic levitation structures are arranged to operate independently of each other without interference, and a repulsive force between the superconductor and the magnet of each of the superconducting magnetic levitation structures is set to be adjustable,
wherein each of the superconducting magnetic levitation structures further comprises a temperature control device configured to adjust a temperature of the superconductor, the temperature of each superconductor being independently adjustable,
wherein the superconductor in each of the superconducting magnetic levitation structures is disposed on the support platform, and the magnet is disposed on the base,
wherein the support platform comprises a mounting layer and an electromagnetic shielding layer, the electromagnetic shielding layer is located on a side of the mounting layer facing away from the base, and the superconductor is disposed inside the mounting layer,
wherein the mounting layer is provided with a vacuum heat insulation chamber that divides the mounting layer into a plurality of mounting portions each of which provided with one superconductor.

2. The support device according to claim 1, wherein the magnet is an electromagnet configured to generate an adjustable magnetic field.

3. The support device according to claim 1, wherein the temperature control device and the superconductor are disposed adjacent to and spaced apart from each other in each of the mounting portions.

4. The support device according to claim 1, wherein the temperature control device is disposed to surround the superconductor in each of the mounting portions.

5. The support device according to claim 4, wherein the temperature control device and the superconductor are in contact with each other.

6. The support device according to claim 1, wherein an isolation device adjacent to the electromagnetic shielding layer and the vacuum heat insulation chamber is disposed in each of the mounting portions.

7. The support device according to claim 6, wherein the isolation device comprises an electromagnetic isolation member disposed adjacent to the vacuum heat insulation chamber and a heat insulation member disposed adjacent to the electromagnetic shielding layer.

8. The support device according to claim 1, wherein an electromagnetic shielding member that separates the respective magnets from each other is disposed in the base.

9. The support device according to claim 1, wherein there are two superconducting magnetic levitation structures.

10. The support device according to claim 1, wherein there are three superconducting magnetic levitation structures.

11. The support device according to claim 1, wherein a material of the superconductor comprises Yttrium Barium Copper Oxide (YBCO).

12. A display apparatus, comprising a display device and the support device according to claim 1, wherein the display device is disposed on a surface of the support platform facing away from the base.

* * * * *